(12) United States Patent
Kim et al.

(10) Patent No.: US 10,865,329 B2
(45) Date of Patent: Dec. 15, 2020

(54) ADHESIVE FILM FOR SEMICONDUCTOR

(71) Applicant: LG CHEM, LTD., Seoul (KR)

(72) Inventors: Hee Jung Kim, Daejeon (KR); Se Ra Kim, Daejeon (KR); Jung Hak Kim, Daejeon (KR); Seung Hee Nam, Daejeon (KR); Jung Ho Jo, Daejeon (KR); Kwang Joo Lee, Daejeon (KR); Young Kook Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/500,355

(22) PCT Filed: Apr. 29, 2016

(86) PCT No.: PCT/KR2016/004546
§ 371 (c)(1),
(2) Date: Jan. 30, 2017

(87) PCT Pub. No.: WO2016/175612
PCT Pub. Date: Nov. 3, 2016

(65) Prior Publication Data
US 2017/0233610 A1 Aug. 17, 2017

(30) Foreign Application Priority Data
Apr. 29, 2015 (KR) .................. 10-2015-0060690

(51) Int. Cl.
B32B 7/02 (2019.01)
C09J 7/10 (2018.01)
(Continued)

(52) U.S. Cl.
CPC .................. C09J 7/10 (2018.01); B32B 7/06 (2013.01); B32B 7/12 (2013.01); B32B 15/08 (2013.01); B32B 15/082 (2013.01); B32B 15/085 (2013.01); B32B 15/09 (2013.01); B32B 27/06 (2013.01); B32B 27/08 (2013.01); B32B 27/16 (2013.01); B32B 27/18 (2013.01); B32B 27/20 (2013.01); B32B 27/24 (2013.01); B32B 27/26 (2013.01); B32B 27/281 (2013.01); B32B 27/285 (2013.01); B32B 27/286 (2013.01); B32B 27/288 (2013.01); B32B 27/302 (2013.01); B32B 27/304 (2013.01); B32B 27/306 (2013.01); B32B 27/308 (2013.01); B32B 27/32 (2013.01); B32B 27/34 (2013.01); B32B 27/36 (2013.01); B32B 27/38 (2013.01); B32B 27/42 (2013.01); C08L 63/00 (2013.01); C09D 163/00 (2013.01); C09J 7/00 (2013.01); C09J 7/20 (2018.01); C09J 163/00 (2013.01); C09J 163/04 (2013.01); C09J 201/00 (2013.01); H01L 21/6836 (2013.01); H01L 21/78 (2013.01); H01L 23/00 (2013.01); H01L 24/29 (2013.01); B32B 2255/10 (2013.01); B32B 2255/26 (2013.01); B32B 2270/00 (2013.01); B32B 2307/306 (2013.01); B32B 2307/50 (2013.01); B32B 2307/51 (2013.01); B32B 2307/558 (2013.01); B32B 2307/58 (2013.01); B32B 2307/732 (2013.01); B32B 2405/00 (2013.01); B32B 2457/14 (2013.01); B32B 2553/00 (2013.01); C09J 161/12 (2013.01); C09J 2203/326 (2013.01); C09J 2301/162 (2020.08); C09J 2301/208 (2020.08); C09J 2423/006 (2013.01); C09J 2433/00 (2013.01); C09J 2433/006 (2013.01); C09J 2461/00 (2013.01); C09J 2463/00 (2013.01); C09J 2467/005 (2013.01); H01L 2221/68327 (2013.01); H01L 2221/68377 (2013.01); H01L 2221/68381 (2013.01); H01L 2221/68386 (2013.01); H01L 2224/2919 (2013.01); H01L 2224/32145 (2013.01); H01L 2224/32245 (2013.01); H01L 2924/066 (2013.01); H01L 2924/0665 (2013.01);
(Continued)

(58) Field of Classification Search
CPC ............... C09J 163/00; C09J 2203/326; H01L 21/6836; H01L 21/78
See application file for complete search history.

(56) References Cited

U.S. PATENT DOCUMENTS 6,312,801 B1 11/2001 Kim et al.
8,623,512 B2 1/2014 Pyun et al.
(Continued)

FOREIGN PATENT DOCUMENTS

CN 102108276 A 6/2011
CN 104212372 A 12/2014
(Continued)

OTHER PUBLICATIONS

Machine Translation of JP 2008-074928 (Year: 2008).*
Properties of YDCN-703 (http://www.pcformula.com:81/Material_Detail.asp?id=16490) with English translation, 2 pages.
Properties of YDF-8170C (http://www.nscc.nssmc.com/epoxy/ekijo.html) with English translation, 2 pages.
Properties of MILEX XLC-LL (http://www.mitsuichemicalsamerica.com/m/mile_9.htm) 1 page.
(Continued)

Primary Examiner — Maria V Ewald
Assistant Examiner — Zachary M Davis
(74) Attorney, Agent, or Firm — Rothwell, Figg, Ernst & Manbeck, P.C.

(57) ABSTRACT

The present invention relates to an adhesive film for a semiconductor that can more easily bury unevenness such as through wires of a semiconductor substrate or a wire attached to a semiconductor chip and the like, and yet can be applied to various cutting methods without specific limitations to realize excellent cuttability, thus improving reliability and efficiency of a semiconductor packaging process.

16 Claims, No Drawings

(51) Int. Cl.

| | | |
|---|---|---|
| B32B 27/28 | (2006.01) | |
| B32B 27/42 | (2006.01) | |
| B32B 15/08 | (2006.01) | |
| B32B 27/06 | (2006.01) | |
| B32B 15/09 | (2006.01) | |
| B32B 27/30 | (2006.01) | |
| B32B 27/34 | (2006.01) | |
| B32B 27/18 | (2006.01) | |
| B32B 27/24 | (2006.01) | |
| B32B 27/16 | (2006.01) | |
| B32B 15/085 | (2006.01) | |
| B32B 27/08 | (2006.01) | |
| C09J 201/00 | (2006.01) | |
| C09J 7/20 | (2018.01) | |
| B32B 7/06 | (2019.01) | |
| H01L 23/00 | (2006.01) | |
| C08L 63/00 | (2006.01) | |
| C09D 163/00 | (2006.01) | |
| B32B 27/20 | (2006.01) | |
| B32B 15/082 | (2006.01) | |
| B32B 27/26 | (2006.01) | |
| C09J 7/00 | (2018.01) | |
| B32B 7/12 | (2006.01) | |
| B32B 27/32 | (2006.01) | |
| B32B 27/36 | (2006.01) | |
| B32B 27/38 | (2006.01) | |
| C09J 163/00 | (2006.01) | |
| C09J 163/04 | (2006.01) | |
| H01L 21/683 | (2006.01) | |
| H01L 21/78 | (2006.01) | |
| C09J 161/12 | (2006.01) | |

(52) U.S. Cl.
CPC .......... *H01L 2924/2064* (2013.01); *H01L 2924/20102* (2013.01); *H01L 2924/20103* (2013.01); *H01L 2924/20104* (2013.01); *H01L 2924/20641* (2013.01); *H01L 2924/20642* (2013.01); *H01L 2924/20643* (2013.01)

(56) References Cited

U.S. PATENT DOCUMENTS

| 8,716,401 | B2 | 5/2014 | Karasawa et al. | |
|---|---|---|---|---|
| 9,109,147 | B2 | 8/2015 | Park et al. | |
| 2003/0145949 | A1 | 8/2003 | Tanaka et al. | |
| 2007/0241434 | A1 | 10/2007 | Inada et al. | |
| 2007/0241436 | A1* | 10/2007 | Ookubo | C08G 59/18 257/678 |
| 2010/0133703 | A1 | 6/2010 | Karasawa et al. | |
| 2010/0266842 | A1 | 10/2010 | Yamada et al. | |
| 2011/0111218 | A1 | 5/2011 | Yoo et al. | |
| 2011/0152394 | A1* | 6/2011 | Pyun | C08G 59/621 521/135 |
| 2011/0160339 | A1 | 6/2011 | Jeong et al. | |
| 2012/0196404 | A1 | 8/2012 | Ichikawa et al. | |
| 2012/0308832 | A1 | 12/2012 | Satou et al. | |
| 2014/0186607 | A1 | 7/2014 | Wi et al. | |
| 2014/0194555 | A1 | 7/2014 | Lee et al. | |
| 2015/0050780 | A1* | 2/2015 | Kodama | H01L 24/83 438/118 |
| 2015/0225613 | A1 | 8/2015 | Wakayama et al. | |

FOREIGN PATENT DOCUMENTS

| JP | H09-183831 A | 7/1997 | |
|---|---|---|---|
| JP | 2005-307037 A | 11/2005 | |
| JP | 2006-183020 A | 7/2006 | |
| JP | 2007088489 A | 4/2007 | |
| JP | 2007-186590 A | 7/2007 | |
| JP | 2008-074928 A | 4/2008 | |
| JP | 2008179820 A | 8/2008 | |
| JP | 2008-274259 A | 11/2008 | |
| JP | 2009049253 A | 3/2009 | |
| JP | 2009-120830 A | 6/2009 | |
| JP | 2012-144667 A | 8/2012 | |
| JP | 2012214526 A | 11/2012 | |
| JP | 2013018983 A | 1/2013 | |
| JP | 2014-080489 A | 5/2014 | |
| KR | 10-2004-0064722 A | 7/2004 | |
| KR | 10-0956721 B1 | 5/2010 | |
| KR | 10-2010-0061390 A | 6/2010 | |
| KR | 10-2010-0085035 A | 7/2010 | |
| KR | 10-2010-0113764 A | 10/2010 | |
| KR | 10-1045262 B1 | 6/2011 | |
| KR | 10-1089631 B1 | 12/2011 | |
| KR | 10-2012-0059794 A | 6/2012 | |
| KR | 10-2012-0067195 A | 6/2012 | |
| KR | 10-2012-0076271 A | 7/2012 | |
| KR | 10-1240870 B1 | 3/2013 | |
| KR | 10-1381119 B1 | 4/2014 | |
| KR | 10-2014-0126736 A | 10/2014 | |
| TW | 201026800 A1 | 7/2010 | |
| TW | 201130941 A | 9/2011 | |
| TW | 201231586 A1 | 8/2012 | |
| TW | 201425511 A | 7/2014 | |
| WO | 2012/173325 A1 | 12/2012 | |
| WO | WO-2013133275 A1 * | 9/2013 | H01L 24/27 |
| WO | 2014-021450 A1 | 2/2014 | |
| WO | 2014-084357 A1 | 6/2014 | |

OTHER PUBLICATIONS

Search Report and Written Opinion issued for International Application No. PCT/KR2016/004545 dated Aug. 8, 2016 (9 pages).
Search Report and Written Opinion issued for International Application No. PCT/KR2016/004546 dated Aug. 9, 2016 (11 pages).
Phenolite Novalac Resins Data, http://www.dic-global.com/eu/en/products/epoxy/phenolite.html, accessed Sep. 8, 2017 (2 pages).
JER Epoxy Resins Catalogue, https://www.mchemical.co.jp/en/products/departments/mcc/epoxy/product/_icsFiles/afieldfile/2016/10/20/jER_EPOXY_RESINS_ Catalogue_Oct.2016.pdf, accessed Sep. 8, 2017 (11 pages).
Nippon Kayaku Epoxy Data, https://www.nipponkayaku.co.jp/english/company/business/functonalchemicals/files/EpoxyResins.pdf, accessed Sep. 8, 2017 (11 pages).
http://www.mcc-epoxy.jp/catalog/pdf/catalog.pdf (23 pages).

* cited by examiner

ADHESIVE FILM FOR SEMICONDUCTOR

CROSS-REFERENCE TO RELATED APPLICATIONS

This application is a 35 U.S.C. § 371 National Phase Entry Application from PCT/KR2016/004546, filed on Apr. 29, 2016, and designating the United States, which claims priority under 35 U.S.C. § 119 to Korean Patent Application No. 10-2015-0060690, filed on Apr. 29, 2015 with the Korean Intellectual Property Office, the disclosure of which is incorporated herein by reference in its entirety.

TECHNICAL FIELD

The present invention relates to an adhesive film for a semiconductor that can more easily bury unevenness such as from a wire of a semiconductor substrate, a wire attached to a semiconductor chip, and the like, and yet can be applied for various cutting methods without specific limitations to realize excellent cuttability, thus improving reliability and efficiency of a semiconductor packaging process.

BACKGROUND OF ART

Recently, with an increasing tendency of electronic devices toward miniaturization, high performance, and large capacity, a demand for high density and highly integrated semiconductor packages has been rapidly increasing, and thus the size of semiconductor chips increasingly becomes large, and in order to improve the degree of integration, a stack package method of stacking chips in multistages is being increasingly used.

In such a multistage stack structure, in order to secure a space in which a lower bonding wire that electrically connects a lower chip and a substrate is positioned, a spacer is introduced at the interface between the lower chip and the upper chip. In case such a spacer for securing a space is introduced, the total thickness of the package becomes thick and a separate process of attaching the spacer is added.

In order to overcome the problem, recently, a method of filling unevenness such as from a wire and the like using an adhesive having low viscosity at a high temperature is used instead of the spacer. However, there was a limit in that the adhesive having low viscosity may not secure high elasticity and has high elongation at break. Further, if the elasticity of the adhesive itself decreases, due to heat generated when a wafer is cut, the adhesive may be softened to partially generate a burr, and thus it may contaminate the wafer, or may be used by being mixed with an adhesive of the lower support film, thus lowering subsequent pick-up efficiency.

In addition, recently, as a semiconductor chip has become thinner, there is a problem in that the chip is damaged in the existing blade cutting process thus lowering a yield, and in order to overcome this, a preparation process of firstly cutting a semiconductor chip with a blade and then polishing has been suggested. An adhesive should be able to be cut through an expanding process at a low temperature so as to be applied for such a preparation process.

However, an adhesive having low ductility is not easily cut at room temperature, and when allowed to stand at room temperature after being cut, re-adhesion occurs due to the low ductility, consequently lowering the production yield of semiconductor chips.

DETAILED DESCRIPTION OF THE INVENTION

Technical Problem

It is an object of the invention to provide an adhesive film for a semiconductor that can more easily bury unevenness such as through a wire of a semiconductor substrate, a wire attached to a semiconductor chip, and the like, and yet can be applied to various cutting methods without specific limitations to realize excellent cuttability, thus improving reliability and efficiency of a semiconductor packaging process.

Technical Solution

Provided herein is an adhesive film for a semiconductor having a melt viscosity of 1,000 Pa·s to 4,000 Pa·s at a temperature of 110° C. and a shear rate of 5 rad/s, and a modulus generated at 5% to 10% elongation at room temperature of 50 MPa or more.

The adhesive film may be used as a die attachment film (DAF) for attaching a lead frame or a substrate with a die or attaching a die with a die.

The adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

In the adhesive film for a semiconductor, a weight ratio of the total content of the solid epoxy resin and the liquid epoxy resin to the thermoplastic resin may be 1.6 to 2.6, 1.7 to 2.5, 1.75 to 2.4, or 1.8 to 2.3.

In the adhesive film for a semiconductor, a weight ratio of the phenol resin to the total weight of the thermoplastic resin, the phenol resin, and the liquid epoxy resin may be 0.280 or more, or 0.300 to 0.600.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

Also provided herein is an adhesive film for a semiconductor having a melt viscosity of 1,000 Pa·s to 4,000 Pa·s at a temperature of 110° C., a shear rate of 5 rad/s, and elongation at room temperature of 500% or less.

The adhesive film may be used as a die attachment film (DAF) for attaching a lead frame or a substrate with a die or attaching a die with a die.

The adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

In the adhesive film for a semiconductor, a weight ratio of the total content of the solid epoxy resin and the liquid epoxy resin to the thermoplastic resin may be 1.6 to 2.6, 1.7 to 2.5, 1.75 to 2.4, or 1.8 to 2.3.

In the adhesive film for a semiconductor, the weight ratio of the phenol resin to the total weight of the thermoplastic resin, the phenol resin, and the liquid epoxy resin may be 0.280 or more, or 0.300 to 0.600.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

Also provided herein is an adhesive film for a semiconductor having a modulus generated at 5% to 10% elongation at room temperature of 50 MPa or more, and elongation at room temperature of 500% or less.

The adhesive film may be used as a die attachment film (DAF) for attaching a lead frame or a substrate with a die or attaching a die with a die.

The adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

In the adhesive film for a semiconductor, a weight ratio of the total content of the solid epoxy resin and the liquid epoxy resin to the thermoplastic resin may be 1.6 to 2.6, 1.7 to 2.5, 1.75 to 2.4, or 1.8 to 2.3.

In the adhesive film for a semiconductor, a weight ratio of the phenol resin to the total weight of the thermoplastic resin, the phenol resin, and the liquid epoxy resin may be 0.280 or more, or 0.300 to 0.600.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

Also provided herein is an adhesive film for a semiconductor having a melt viscosity of 1,000 Pa·s to 4,000 Pa·s at a temperature of 110° C., a shear rate of 5 rad/s, a modulus generated at 5% to 10% elongation at room temperature of 50 MPa or more, and elongation at room temperature of 500% or less.

The adhesive film for a semiconductor may include thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

In the adhesive film for a semiconductor, a weight ratio of the total content of the solid epoxy resin and the liquid epoxy resin to the thermoplastic resin may be 1.6 to 2.6, 1.7 to 2.5, 1.75 to 2.4, or 1.8 to 2.3.

In the adhesive film for a semiconductor, a weight ratio of the phenol resin to the total weight of the thermoplastic resin, the phenol resin, and the liquid epoxy resin may be 0.280 or more, or 0.300 to 0.600.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

The liquid epoxy resin included in the adhesive film for a semiconductor may have a viscosity of 500 mPa·s to 20,000 mPa·s at 25° C.

The liquid epoxy resin may have an epoxy equivalent weight of 100 to 1,000.

The phenol resin may have a hydroxyl equivalent weight of 80 g/eq to 400 g/eq and a softening point of 70° C. to 160° C.

The phenol resin may have a hydroxyl equivalent weight of 100 g/eq to 178 g/eq.

The phenol resin may have a softening point greater than 100° C. and 160° C. or less, or 105° C. to 150° C.

In the adhesive film for a semiconductor resin, a weight ratio of the liquid epoxy resin to the phenol resin may be 0.5 to 1.5.

The solid epoxy resin included in the adhesive film for a semiconductor resin may include one or more kinds of resins selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl-modified triphenolmethane type of epoxy resin, a naphthalene type of epoxy resin, a dicyclopentadiene type of epoxy resin, and a dicyclopentadiene modified phenol type of epoxy resin.

The solid epoxy resin may have an average epoxy weight equivalent of 100 to 1,000.

The solid epoxy resin may have a softening point of 50° C. to 120° C.

The thermoplastic resin included in the adhesive film for a semiconductor may include one or more kinds of polymer resins selected from the group consisting of polyimide, polyether imide, polyester imide, polyamide, polyether sulfone, polyether ketone, polyolefin, polyvinylchloride, phenoxy, reactive butadiene acrylonitrile copolymer rubber, and (meth)acrylate-based resin.

The (meth)acrylate-based resin may be a (meth)acrylate-based resin including a (meth)acrylate-based repeat unit containing an epoxy-based functional group, and having a glass transition temperature of −10° C. to 20° C.

The (meth)acrylate-based resin may include 0.1 wt % to 10 wt % of (meth)acrylate-based repeat units containing an epoxy-based functional group.

The curing agent included in the adhesive film for a semiconductor may further include one or more kinds of compounds selected from the group consisting of an amine-based curing agent and an acid anhydride-based curing agent.

The adhesive film for a semiconductor may further include an ion scavenger including: a metal oxide including one or more metals selected from the group consisting of zirconium, antimony, bismuth, magnesium, and aluminum; porous silicate; porous alumino silicate; or zeolite.

The adhesive film for a semiconductor may further include one or more kinds of curing catalysts selected from the group consisting of a phosphorous compound, a phosphorous-boron compound, and an imidazole-based compound.

The adhesive film for a semiconductor may further include one or more kinds of additives selected from the group consisting of a coupling agent and an inorganic filler.

Further, the adhesive film for a semiconductor may be a die bonding film.

Also, provided herein is a dicing die bonding film including: a base film; a tacky layer formed on the base film; and an adhesive layer including the above adhesive film for a semiconductor, formed on the tacky layer.

The base film may have a thickness of 10 μm to 200 μm, the tacky layer may have a thickness of 1 μm to 600 μm, 3 μm to 500 μm, or 5 μm to 300 μm, and the adhesive film may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

Also provided herein is a method for dicing a semiconductor wafer, including the steps of: partially pre-treating a semiconductor wafer including the dicing die bonding film; laminating a wafer on at least one side of the dicing die bonding film so as to be completely cut or cuttable; and irradiating UV to the base film of the pre-treated semiconductor wafer and picking up individual chips separated by the cutting of the semiconductor.

Advantageous Effects

According to the present invention, provided is an adhesive film for a semiconductor that can more easily bury unevenness such as a wire of a semiconductor substrate, a wire attached to a semiconductor chip, and the like, and yet realize high heat resistance and adhesive strength, and improved mechanical properties, and can be applied for various cutting methods without specific limitations to realize excellent cuttability, thus improving reliability and efficiency of a semiconductor packaging process.

The adhesive film for a semiconductor, due to the unique properties, can be applied for non-contact-type adhesive cutting, for example, DBG (Dicing Before Grinding), as well as wafer cutting using a knife blade, and has excellent cuttability even at a relatively low temperature, and thus, even if it is allowed to stand at room temperature, possibility of readhesion becomes low, thus increasing reliability and efficiency in a semiconductor manufacturing process.

Further, the adhesive film for a semiconductor can be applied to various semiconductor package manufacturing processes, enables securing of high reliability in the adhesion process of a semiconductor tip and a support member such as a substrate or a chip of the lower layer, and can realize excellent workability while securing heat resistance, moisture tolerance, and an insulation property required when a semiconductor tip is installed in a semiconductor package.

In addition, the adhesive film for a semiconductor may secure improved elasticity and high mechanical properties, thus preventing burr generation in a dicing die bonding film including the same and in a method for dicing a semiconductor wafer using the dicing die bonding film, further increasing pick-up efficiency in a dicing process, and securing high cuttability at low and high temperatures.

DETAILED DESCRIPTION OF THE EMBODIMENTS

Adhesive films for a semiconductor according to specific embodiments of the invention will now be explained in detail.

According to one embodiment of the invention, provided is an adhesive film for a semiconductor having a melt viscosity of 1,000 Pa·s to 4,000 Pa·s at a temperature of 110° C., a shear rate of 5 rad/s, and a modulus generated at 5% to 10% elongation at room temperature of 50 MPa or more.

Previously, considering buriability of an adhesive film for a semiconductor and the like, a method of adding components having a low softening point to decrease melt viscosity has been suggested, but this method has a limit in that it is difficult to secure high elasticity and elongation at break.

Thus, the inventors confirmed through experiments that an adhesive film for a semiconductor having the above-described specific properties can more easily bury unevenness such as through a wire of a semiconductor substrate, a wire attached to a semiconductor chip, and the like, and yet can be applied to various cutting methods without specific limitations to realize excellent cuttability, thus improving reliability and efficiency of a semiconductor packaging process, and completed the invention.

Specifically, since a modulus generated at 5% to 10% elongation of the adhesive film for a semiconductor at room temperature is 50 MPa or more, or 50 MPa to 300 MPa, the adhesive film of the embodiment may be easily applied for non-contact-type cutting methods, for example, DBG (Dicing Before Grinding), as well as a wafer cutting method using a knife blade, and thus has excellent cuttability even at a low temperature.

If a modulus generated at 5% to 10% elongation of the adhesive film for a semiconductor at room temperature is less than 50 MPa, even if expanding is conducted at a low temperature, cuttability may not be sufficient; if allowed to stand at room temperature, readhesion may occur; and due to the heat generated when cutting a wafer to which the adhesive film is bonded, adhesive may be softened to generate burr in the adhesive film, thus contaminating the circuit side of a semiconductor chip.

Moreover, the adhesive film for a semiconductor has a melt viscosity of 1,000 Pa·s to 4,000 Pa·s at a temperature of 110° C. and a shear rate of 5 rad/s. As the adhesive film has relatively low viscosity at a temperature of about 110° C., it may have excellent adhesive strength and flow properties that are optimized for a semiconductor, it may be advantageous for void removal at the interface of initial stage curing and in a die attachment process, and after die attachment, penetration of a bonding wire into a surrounding space may be smoothly achieved without significantly influencing the shape or properties of the adhesive film.

Further, as the adhesive film for a semiconductor has a melt viscosity of 1,000 Pa·s to 4,000 Pa·s at a temperature of 110° C. and a shear rate of 5 rad/s, even if exposed to high temperature conditions that are applied in a semiconductor manufacturing process for a long time, a void may not be substantially generated, and when applied for a dicing die bonding film and the like, a sufficient high temperature shearing force may be secured, thus securing excellent cuttability.

The adhesive film may be used as a die attachment film (DAF) for attaching a lead frame or a substrate with a die or attaching a die with a die. Thus, the adhesive film may be processed in the form of a die bonding film, a dicing die bonding film, and the like.

As explained above, if the adhesive film for a semiconductor fulfills the requirements of a melt viscosity of 1,000 Pa·s to 4,000 Pa·s at a temperature of 110° C., a shear rate of 5 rad/s, and a modulus generated at 5% to 10% elongation at room temperature of 50 MPa or more, the above-explained effects may be realized, and the specific components are not significantly limited.

For example, the adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

The epoxy resin may form a base (or matrix) of the adhesive component together with the thermoplastic resin having a glass transition temperature of −10° C. to 20° C. and a curing agent containing a phenol resin having a softening point of 70° C. or more, and it allows the adhesive film for a semiconductor to have high breaking strength and low elongation at break while having low viscosity.

In the adhesive film for a semiconductor, the weight ratio of the total content of the solid epoxy resin and the liquid epoxy resin to the thermoplastic resin may be 1.6 to 2.6, 1.7 to 2.5, 1.75 to 2.4, or 1.8 to 2.3.

As the adhesive film for a semiconductor includes the above-explained range of the solid epoxy resin and the liquid epoxy resin compared to the thermoplastic resin, the adhesive film for a semiconductor may have low viscosity at a high temperature, and yet realize high elasticity, excellent mechanical properties, and high adhesive strength. Previously known adhesive films for a semiconductor could not realize unique properties of the adhesive film for a semiconductor of the above-explained embodiment, on the ground of a relatively small content of epoxy resin compared to thermoplastic resin, and the like.

If the weight ratio of the total contents of the solid epoxy resin and the liquid epoxy resin to the thermoplastic resin is lower than the above-explained range in the adhesive film for a semiconductor, the adhesive film for a semiconductor may exhibit high viscosity at a high temperature or exhibit low breaking strength and high elongation at break, and a high temperature shearing force may also be lowered, and thus cuttability may not be sufficiently secured.

Further, if the weight ratio of the total contents of the solid epoxy resin and the liquid epoxy resin to the thermoplastic resin is greater than 2.6 in the adhesive film for a semiconductor, a modulus generated at 5% to 10% elongation of the adhesive film for a semiconductor at room temperature may become significantly high, or elongation of the adhesive film at room temperature may be significantly lowered, thus largely inhibiting workability.

In addition, if the weight ratio of the total contents of the solid epoxy resin and the liquid epoxy resin to the thermoplastic resin is greater than 2.6 in the adhesive film for a semiconductor, in the curing process, the increase rate of the viscosity of the adhesive film for a semiconductor may be significantly increased, and thus it may be difficult to remove a void inside the film, which may impede reliability of a semiconductor package.

Meanwhile, in the adhesive film for a semiconductor, the weight ratio of the phenol resin to the total weight of the thermoplastic resin, the phenol resin and the liquid epoxy resin may be 0.280 or more, or 0.300 to 0.600.

The phenol resin may form a base (or matrix) of the adhesive component together with the liquid epoxy resin and the thermoplastic resin having a glass transition temperature of −10° C. to 20° C., wherein the phenol resin is preferably included in the content above a certain level in the base of the adhesive component.

Specifically, if the weight ratio of the phenol resin to the total weight of the thermoplastic resin, the phenol resin, and the liquid epoxy resin is less than 0.280 in the adhesive film for a semiconductor, a sufficient curing degree may not be afforded to the adhesive film for a semiconductor, thus lowering heat resistance, the modulus generated at 5% to 10% elongation of the adhesive film at room temperature may be significantly lowered, and yet elongation of the adhesive film at room temperature may be significantly increased, and in a dicing die bonding film manufactured using the adhesive film, burrs may be excessively generated through a dicing process, and high temperature shearing force may also be decreased and thus cuttability may not be sufficiently secured.

Meanwhile, the curing agent included in the adhesive film for a semiconductor may include a phenol resin having a softening point of 70° C. or more. The phenol resin may have a softening point of 70° C. or more, 80° C. or more, 70° C. to 160° C., greater than 100° C. and 160° C. or less, or 105° C. to 150° C.

The adhesive film for a semiconductor of the above embodiment may include a phenol resin having a relatively high softening point, and the phenol resin having a softening point of 70° C. or more, 80° C. or more, 70° C. to 160° C., greater than 100° C. and 160° C. or less, or 105° C. to 150° C. may form a base (or matrix) of the adhesive component together with the liquid epoxy resin and the thermoplastic resin having a glass transition temperature of −10° C. to 20° C., and affords a higher tensile modulus and excellent adhesive strength at room temperature and flow properties optimized for a semiconductor to the adhesive film for a semiconductor.

To the contrary, if the softening point of the phenol resin is less than the above-explained range, the tensile modulus of the adhesive film for a semiconductor at room temperature may be lowered or elongation at room temperature may be significantly increased, and melt viscosity of the adhesive film for a semiconductor may be decreased or the modulus may be lowered, and thus more burrs may be generated by heat generated in a dicing process or cuttability or pick-up efficiency may be lowered. Further, if a process of bonding the adhesive film or the adhesive film is exposed to high temperature conditions for a long time, a lot of bleed-out may be generated.

In addition, the phenol resin may have a hydroxyl equivalent weight of 80 g/eq to 400 g/eq, 90 g/eq to 250 g/eq, 100 g/eq to 178 g/eq, or 210 to 240 g/eq. As the phenol resin has the above-explained hydroxyl equivalent weight range, a curing degree may be increased even with a short curing time, thus affording a higher tensile modulus and excellent adhesive strength at room temperature to the adhesive film for a semiconductor.

In the adhesive film for a semiconductor of the above embodiment, the weight ratio of the liquid epoxy resin to the phenol resin may be 0.5 to 1.5.

If the weight ratio of the liquid epoxy resin to the phenol resin is too high, breaking strength of the adhesive film for a semiconductor may be significantly increased, tensile modulus at room temperature may be lowered, and cuttability or efficiency may be lowered in a low temperature cutting process.

Further, if the weight ratio of the liquid epoxy resin to the phenol resin is too low, a modulus generated at elongation at room temperature may become too high, or elongation at room temperature may be significantly lowered, thus significantly lowering the yield of the final product, and the adhesive film for a semiconductor may not have sufficient adhesion to a wafer, thus generating debonding between the wafer and an adhesive film in a manufacturing process.

Specific kinds and properties of the liquid epoxy resin are not significantly limited, but for example, the liquid epoxy resin may have a viscosity of 500 mPa·s to 20,000 mPa·s at 25° C. Further, the liquid epoxy resin may have an epoxy equivalent weight of 100 to 1,000.

Meanwhile, the liquid epoxy resin may form a base (or matrix) of the adhesive component together with the thermoplastic resin having a glass transition temperature of −10° C. to 20° C. and the curing agent containing a phenol resin, and allows the adhesive film to have a relatively low viscosity and yet have excellent adhesive strength and flow properties optimized for a semiconductor, and thus may be favorable for void removal at the interface of initial stage curing and in a die attachment process.

Meanwhile, as explained above, the adhesive film for a semiconductor may include a thermoplastic resin having a glass transition temperature of −10° C. to 20° C.

Examples of the thermoplastic resin are not specifically limited, but for example, may include polyimide, polyether imide, polyester imide, polyamide, polyether sulfone, polyether ketone, polyolefin, polyvinylchloride, phenoxy, reactive butadiene acrylonitrile copolymer rubber, (meth) acrylate-based resin, a mixture of two or more kinds thereof, or a copolymer of two or more kinds thereof.

Specifically, the (meth)acrylate-based resin may be a (meth)acrylate-based resin including a (meth)acrylate-based repeat unit including an epoxy-based functional group, and having a glass transition temperature of −10° C. to 20° C.

By using the (meth)acrylate-based resin including a (meth)acrylate-based repeat unit including an epoxy-based functional group, and having a glass transition temperature of −10° C. to 20° C., in case the adhesive film for a semiconductor is used for multistage stacking of a ultrathin wafer, high impact resistance may be secured and electrical properties after semiconductor manufacture may be improved.

The epoxy-based functional group may be substituted one or more at repeat units making up the main chain of the (meth)acrylate-based resin.

The epoxy-based functional group may include an epoxy group or a glycidyl group.

A (meth)acrylate-based resin including the (meth)acrylate-based repeat units including the epoxy-based functional groups in the content of 0.1 wt % to 10 wt % may have a glass transition temperature of −10° C. to 20° C., or −5° C. to 15° C. By using a (meth)acrylate-based resin having the above-explained glass transition temperature, the adhesive film for a semiconductor may have sufficient flowability and the finally prepared adhesive film may secure high adhesive strength, and it is easy to prepare the adhesive film for a semiconductor in the form of a thin film and the like.

In order to control the curing degree of the adhesive film for a semiconductor or increase adhesion performance and the like, the adhesive film may include a solid epoxy resin.

Specific examples of the solid epoxy resin may include one or more kinds of polymer resins selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

The solid epoxy resin may have a softening point of 50° C. to 120° C. If the softening point of the solid epoxy resin is too low, adhesive strength of the adhesive film for a semiconductor may increase to decrease pick-up of chips after dicing, and if the softening point of the solid epoxy resin is too high, flowability of the adhesive film for a semiconductor may be lowered, and the adhesive strength may be lowered.

The solid epoxy resin may have an epoxy equivalent weight of 100 to 1,000.

If the content of the thermoplastic resin is too low in the adhesive film for a semiconductor, a modulus after curing of the resin composition may rapidly increase, and thus it is difficult to expect a stress relaxation effect between a substrate and a wafer. Further, if the content of the thermoplastic resin is too high, viscosity of the composition at B-stage may increase, and thus adhesion to a substrate may decrease in a die attachment process, and void removal during a curing process may become difficult, thus lowering reliability of the process and the final product.

If the content of the curing agent containing phenol resin is too low, it may be difficult to secure sufficient heat resistance. If the content of the curing agent containing phenol resin is too high, even if curing is completed, non-reacted phenol groups may remain to increase hygroscopicity, and thus in a reflow process after moisture absorption in a semiconductor packaging process, delamination between a substrate and adhesive may be caused.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

According to another embodiment of the invention, provided is an adhesive film for a semiconductor having a melt viscosity of 1,000 Pa·s to 4,000 Pa·s at a temperature of 110° C., a shear rate of 5 rad/s, and elongation at room temperature of 500% or less.

Previously, considering buriability of an adhesive film for a semiconductor and the like, a method of adding components having a low softening point to decrease melt viscosity has been suggested, but this method has a limit in that it is difficult to secure high elasticity and elongation at break is high.

Thus, the inventors confirmed through experiments that an adhesive film for a semiconductor having the above-described specific properties can more easily bury unevenness such as through a wire of a semiconductor substrate or a wire attached to a semiconductor chip, and the like, and yet can be applied for various cutting methods without specific limitations to realize excellent cuttability, thus improving reliability and efficiency of a semiconductor packaging process, and completed the invention.

Specifically, the adhesive film for a semiconductor has a melt viscosity of 1,000 Pa·s to 4,000 Pa·s at a temperature of 110° C. and a shear rate of 5 rad/s. As the adhesive film has relatively low viscosity at a temperature of about 110° C., it may have excellent adhesive strength and flow properties optimized for a semiconductor, it may be favorable for void removal at the interface of initial stage curing and in a die attachment process, and after die attachment, penetration of a bonding wire into a surrounding space may be smoothly achieved without significantly influencing the shape or properties of the adhesive film.

Further, as the adhesive film for a semiconductor has a melt viscosity of 1,000 Pa·s to 4,000 Pa·s at a temperature of 110° C. and a shear rate of 5 rad/s, even if exposed to high temperature conditions that are applied in a semiconductor manufacturing process for a long time, voids may not be substantially generated, and when applied to a dicing die bonding film and the like, sufficient high temperature shearing force may be secured, thus securing excellent cuttability.

Moreover, the adhesive film for a semiconductor may have elongation at room temperature of 500% or less, 50 to 500%, or 100 to 400%. Since the adhesive film for a semiconductor has relatively high elasticity and yet exhibits low elongation and low elongation at break, it may have excellent cuttability even at a low temperature, and secure excellent cuttability even when non-contact type cutting methods, for example, DBG (Dicing Before Grinding), are applied, as well as a wafer cutting method using a knife blade.

Meanwhile, if the adhesive film for a semiconductor exhibits elongation greater than 500% at room temperature, even if expanding is conducted at a low temperature, cuttability may not be sufficient; if allowed to stand at room temperature, readhesion may occur; and due to the heat generated when cutting a wafer to which the adhesive film is bonded, adhesive may be softened to generate burrs in the adhesive film, thus contaminating the circuit side of a semiconductor chip.

The adhesive film may be used as a die attachment film (DAF) for attaching a lead frame or a substrate with a die or attaching a die with a die. Thus, the adhesive film may be processed in the form of a die bonding film, a dicing die bonding film, and the like.

As explained above, if the adhesive film for a semiconductor fulfills the requirements of a melt viscosity of 1,000 Pa·s to 4,000 Pa·s at a temperature of 110° C., a shear rate of 5 rad/s, and elongation at room temperature of 500% or more, the above-explained effects may be realized, and the specific components are not significantly limited.

For example, the adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

The epoxy resin may form a base (or matrix) of the adhesive component together with the thermoplastic resin having a glass transition temperature of −10° C. to 20° C. and a curing agent containing a phenol resin having a softening point of 70° C. or more, and it allows the adhesive film for a semiconductor to have low viscosity and yet have high breaking strength and low elongation at break.

In the adhesive film for a semiconductor, the weight ratio of the total contents of the solid epoxy resin and the liquid epoxy resin to the thermoplastic resin may be 1.6 to 2.6, 1.7 to 2.5, 1.75 to 2.4, or 1.8 to 2.3.

As the adhesive film for a semiconductor includes the above-explained range of the solid epoxy resin and the liquid epoxy resin compared to the thermoplastic resin, the adhesive film for a semiconductor may have low viscosity at high temperature, and yet realize high elasticity, excellent mechanical properties, and high adhesive strength. Previously known adhesive films for a semiconductor could not realize unique properties of the adhesive film for a semiconductor of the above-explained embodiment, on the ground of a relatively small content of epoxy resin compared to thermoplastic resin, and the like.

If the weight ratio of the total contents of the solid epoxy resin and the liquid epoxy resin to the thermoplastic resin is lower than the above-explained range in the adhesive film for a semiconductor, the adhesive film for a semiconductor may exhibit high viscosity at a high temperature or exhibit low breaking strength and high elongation at break, and the high temperature shearing force may also be lowered, and thus cuttability may not be sufficiently secured.

Further, if the weight ratio of the total contents of the solid epoxy resin and the liquid epoxy resin to the thermoplastic resin is greater than 2.6 in the adhesive film for a semiconductor, a modulus generated at 5% to 10% elongation of the adhesive film for a semiconductor at room temperature may become significantly high, or elongation of the adhesive film at room temperature may be significantly lowered, thus largely inhibiting workability.

In addition, if the weight ratio of the total contents of the solid epoxy resin and the liquid epoxy resin to the thermoplastic resin is greater than 2.6 in the adhesive film for a semiconductor, in the curing process, the increase rate of the viscosity of the adhesive film for a semiconductor may be significantly increased, and thus it may be difficult to remove a void inside the film, which may impede reliability of a semiconductor package.

Meanwhile, in the adhesive film for a semiconductor, the weight ratio of the phenol resin to the total weight of the thermoplastic resin, the phenol resin, and the liquid epoxy resin may be 0.280 or more, or 0.300 to 0.600.

The phenol resin may form a base (or matrix) of the adhesive component together with the liquid epoxy resin and the thermoplastic resin having a glass transition temperature of −10° C. to 20° C., wherein the phenol resin is preferably included in the content above a certain level in the base of the adhesive component.

Specifically, if the weight ratio of the phenol resin to the total weight of the thermoplastic resin, the phenol resin, and the liquid epoxy resin is less than 0.280 in the adhesive film for a semiconductor, a sufficient curing degree may not be afforded to the adhesive film for a semiconductor, thus lowering heat resistance; a modulus generated at 5% to 10% elongation of the adhesive film at room temperature may be significantly lowered, and yet elongation of the adhesive film at room temperature may be significantly increased; and, in a dicing die bonding film manufactured using the adhesive film, burrs may be excessively generated through a dicing process, and high temperature shearing force may also be decreased, and thus cuttability may not be sufficiently secured.

Meanwhile, the curing agent included in the adhesive film for a semiconductor may include a phenol resin having a softening point of 70° C. or more. The phenol resin may have a softening point of 70° C. or more, 80° C. or more, 70° C. to 160° C., greater than 100° C. and 160° C. or less, or 105° C. to 150° C.

The adhesive film for a semiconductor of the above embodiment may include a phenol resin having a relatively high softening point, and the phenol resin having a softening point of 70° C. or more, 80° C. or more, 70° C. to 160° C., greater than 100° C. and 160° C. or less, or 105° C. to 150° C. may form a base (or matrix) of the adhesive component together with the liquid epoxy resin and the thermoplastic resin having a glass transition temperature of −10° C. to 20° C., and affords a higher tensile modulus and excellent adhesive strength at room temperature and flow properties optimized for a semiconductor to the adhesive film for a semiconductor.

To the contrary, if the softening point of the phenol resin is less than the above-explained range, the tensile modulus of the adhesive film for a semiconductor at room temperature may be lowered or elongation at room temperature may be significantly increased, and melt viscosity of the adhesive film for a semiconductor may be decreased or the modulus may be lowered, and thus more burrs may be generated by heat generated in a dicing process or cuttability or pick-up efficiency may be lowered. Further, if a process of bonding the adhesive film or the adhesive film is exposed to high temperature conditions for a long time, a lot of bleed-out may be generated.

In addition, the phenol resin may have a hydroxyl equivalent weight of 80 g/eq to 400 g/eq, or 100 g/eq to 200 g/eq. As the phenol resin has the above-explained hydroxyl equivalent weight range, a curing degree may be increased even with a short curing time, thus affording a higher tensile modulus and excellent adhesive strength at room temperature to the adhesive film for a semiconductor.

In the adhesive film for a semiconductor of the above embodiment, the weight ratio of the liquid epoxy resin to the phenol resin may be 0.5 to 1.5.

If the weight ratio of the liquid epoxy resin to the phenol resin is too high, breaking strength of the adhesive film for a semiconductor may be significantly increased, the tensile modulus at room temperature may be lowered, and cuttability or efficiency may be lowered in a low temperature cutting process.

Further, if the weight ratio of the liquid epoxy resin to the phenol resin is too low, the modulus generated at elongation at room temperature may become too high, or elongation at room temperature may be significantly lowered, thus significantly lowering the yield of the final product, and the adhesive film for a semiconductor may not have sufficient adhesion to a wafer, thus generating debonding between a wafer and an adhesive film in a manufacturing process.

Specific kinds and properties of the liquid epoxy resin are not significantly limited, but for example, the liquid epoxy resin may have a viscosity of 500 mPa·s to 20,000 mPa·s at 25° C. Further, the liquid epoxy resin may have an epoxy equivalent weight of 100 to 1,000.

Meanwhile, the liquid epoxy resin may form a base (or matrix) of the adhesive component together with the thermoplastic resin having a glass transition temperature of −10° C. to 20° C. and the curing agent containing phenol resin, and allows the adhesive film to have relatively low viscosity and yet have excellent adhesive strength and flow properties optimized for a semiconductor, and thus may be favorable for void removal at the interface of initial stage curing and in a die attachment process.

As explained above, the adhesive film for a semiconductor may include a thermoplastic resin having a glass transition temperature of −10° C. to 20° C.

The examples of the thermoplastic resin is not specifically limited, but for example, may include polyimide, polyether imide, polyester imide, polyamide, polyether sulfone, polyether ketone, polyolefin, polyvinylchloride, phenoxy, reactive butadiene acrylonitrile copolymer rubber, (meth)acrylate-based resin, a mixture of two or more kinds thereof, or a copolymer of two or more kinds thereof.

Specifically, the (meth)acrylate-based resin may be a (meth)acrylate-based resin including (meth)acrylate-based repeat units including an epoxy-based functional group, and having a glass transition temperature of −10° C. to 20° C.

By using the (meth)acrylate-based resin including (meth)acrylate-based repeat units including an epoxy-based functional group and having a glass transition temperature of −10° C. to 20° C., in case the adhesive film for a semiconductor is used for multistage lamination of an ultrathin wafer, high impact resistance may be secured and electrical properties after semiconductor manufacture may be improved.

The epoxy-based functional group may be substituted one or more at repeat units making up the main chain of the (meth)acrylate-based resin.

The epoxy-based functional group may include an epoxy group or a glycidyl group

A (meth)acrylate-based resin including the (meth)acrylate-based repeat units including an epoxy-based functional group in the content of 0.1 wt % to 10 wt % may have a glass transition temperature of −10° C. to 20° C., or −5° C. to 15° C. By using a (meth)acrylate-based resin having the above-explained glass transition temperature, the adhesive film for a semiconductor may have sufficient flowability and the finally prepared adhesive film may secure high adhesive strength, and it is easy to prepare the adhesive film for a semiconductor in the form of a thin film and the like.

In order to control the curing degree of the adhesive film for a semiconductor or increase adhesion performance and the like, the adhesive film may include a solid epoxy resin.

Specific examples of the solid epoxy resin may include one or more kinds of polymer resins selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

The solid epoxy resin may have a softening point of 50° C. to 120° C. If the softening point of the solid epoxy resin is too low, adhesive strength of the adhesive film for a semiconductor may increase to decrease pick-up of chips after dicing, and if the softening point of the solid epoxy resin is too high, flowability of the adhesive film for a semiconductor may be lowered, and the adhesive strength may be lowered.

The solid epoxy resin may have an epoxy equivalent weight of 100 to 1,000.

If the content of the thermoplastic resin is too low in the adhesive film for a semiconductor, the modulus after curing of the resin composition may rapidly increase, and thus it is difficult to expect a stress relaxation effect between a substrate and a wafer. Further, if the content of the thermoplastic resin is too high, viscosity of the composition at a B-stage may increase, and thus adhesion to a substrate may decrease in a die attachment process, and void removal during a curing process may become difficult, thus lowering reliability of the process and the final product.

If the content of the curing agent containing phenol resin is too low, it may be difficult to secure sufficient heat resistance. If the content of the curing agent containing phenol resin is too high, even if curing is completed, non-reacted phenol groups may remain to increase hygroscopicity, and thus in a reflow process after moisture absorption in a semiconductor packaging process, delamination between a substrate and adhesive may be caused.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

According to another embodiment of the invention, provided is an adhesive film for a semiconductor having a melt viscosity of 1,000 Pa·s to 4,000 Pa·s at a temperature of 110° C., a shear rate of 5 rad/s, and elongation at room temperature of 500% or less.

Previously known adhesive films for a semiconductor could not secure low elongation at break together with high elasticity, and thus could not realize sufficient buriability and cuttability.

Thus, the inventors confirmed through experiments that an adhesive film for a semiconductor having the above-described specific properties can more easily bury unevenness such as through a wire of a semiconductor substrate or a wire attached to a semiconductor chip, and the like, and yet can be applied for various cutting methods without specific limitations to realize excellent cuttability, thus improving reliability and efficiency of a semiconductor packaging process, and completed the invention.

Specifically, since a modulus generated at 5% to 10% elongation of the adhesive film for a semiconductor at room temperature is 50 MPa or more, or 50 MPa to 300 MPa, the adhesive film of the embodiment may be easily applied for non-contact type cutting methods, for example, DBG (Dicing Before Grinding), as well as a wafer cutting method using a knife blade, and thus have excellent cuttability even at a low temperature.

If a modulus generated at 5% to 10% elongation of the adhesive film for a semiconductor at room temperature is less than 50 MPa, even if expanding is conducted at a low temperature, cuttability may not be sufficient; if allowed to stand at room temperature, readhesion may occur; and due to the heat generated when cutting a wafer to which the adhesive film is bonded, adhesive may be softened to generate burrs in the adhesive film, thus contaminating the circuit side of a semiconductor chip.

Moreover, the adhesive film for a semiconductor may have elongation of 500% or less, 50 to 500%, or 100 to 400% at room temperature. Since the adhesive film for a semiconductor has relatively high elasticity and yet exhibits low elongation and low elongation at break, it may have excellent cuttability even at a low temperature, and may secure excellent cuttability even when non-contact type cutting methods, for example, DBG (Dicing Before Grinding), are applied as well as a wafer cutting method using a knife blade.

Meanwhile, if the adhesive film for a semiconductor exhibits elongation greater than 500%, even if expanding is conducted at a low temperature, cuttability may not be sufficient; if allowed to stand at room temperature, readhesion may occur; and due to the heat generated when cutting a wafer to which the adhesive film is bonded, the adhesive may be softened to generate burrs in the adhesive film, thus contaminating the circuit side of a semiconductor chip.

The adhesive film may be used as a die attachment film (DAF) for attaching a lead frame or a substrate with a die or attaching a die with a die. Thus, the adhesive film may be processed in the form of a die bonding film, a dicing die bonding film, and the like.

As explained above, if the adhesive film for a semiconductor fulfills the requirements of the modulus generated at 5% to 10% elongation at room temperature of 50 MPa or more and elongation at room temperature of 500% or less, the above-explained effects may be realized, and the specific components are not significantly limited.

For example, the adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

More specifically, the adhesive film for a semiconductor may include: a continuous phase base including a thermoplastic resin having a glass transition temperature of −10° C. to 20° C., a curing agent containing a phenol resin having a softening point of 70° C. or more, and a liquid epoxy resin; and a solid epoxy resin dispersed in the continuous phase base.

The epoxy resin may form a base (or matrix) of the adhesive component together with the thermoplastic resin having a glass transition temperature of −10° C. to 20° C. and a curing agent containing phenol resin having a softening point of 70° C. or more, and it allows the adhesive film for a semiconductor to have high breaking strength and low elongation at break while having low viscosity.

In the adhesive film for a semiconductor, the weight ratio of the total content of the solid epoxy resin and the liquid epoxy resin to the thermoplastic resin may be 1.6 to 2.6, 1.7 to 2.5, 1.75 to 2.4, or 1.8 to 2.3.

As the adhesive film for a semiconductor includes the above-explained range of the solid epoxy resin and the liquid epoxy resin compared to the thermoplastic resin, the adhesive film for a semiconductor may have low viscosity at a high temperature, and yet realize high elasticity, excellent mechanical properties, and high adhesive strength. Previously known adhesive films for a semiconductor could not realize unique properties of the adhesive film for a semiconductor of the above-explained embodiment, on the grounds of a relatively small content of epoxy resin compared to thermoplastic resin, and the like.

If the weight ratio of the total contents of the solid epoxy resin and the liquid epoxy resin to the thermoplastic resin is lower than the above-explained range in the adhesive film for a semiconductor, the adhesive film for a semiconductor may exhibit high viscosity at a high temperature or exhibit low breaking strength and high elongation at break, and high temperature shearing force may also be lowered, and thus cuttability may not be sufficiently secured.

Further, if the weight ratio of the total contents of the solid epoxy resin and the liquid epoxy resin to the thermoplastic resin is greater than 2.6 in the adhesive film for a semiconductor, a modulus generated at 5% to 10% elongation of the adhesive film for a semiconductor at room temperature may become significantly high, or elongation of the adhesive film at room temperature may be significantly lowered, thus largely inhibiting workability.

In addition, if the weight ratio of the total contents of the solid epoxy resin and the liquid epoxy resin to the thermoplastic resin is greater than 2.6 in the adhesive film for a semiconductor, in the curing process, the increase rate of the viscosity of the adhesive film for a semiconductor may be significantly increased, and thus it may be difficult to remove a void inside the film, which may impede reliability of a semiconductor package.

Meanwhile, in the adhesive film for a semiconductor, the weight ratio of the phenol resin to the total weight of the thermoplastic resin, the phenol resin, and the liquid epoxy resin may be 0.280 or more, or 0.300 to 0.600.

The phenol resin may form a base (or matrix) of the adhesive component together with the liquid epoxy resin and the thermoplastic resin having a glass transition temperature of −10° C. to 20° C., wherein the phenol resin is preferably included in the content above a certain level in the base of the adhesive component.

Specifically, if the weight ratio of the phenol resin to the total weight of the thermoplastic resin, the phenol resin, and the liquid epoxy resin is less than 0.280 in the adhesive film for a semiconductor, a sufficient curing degree may not be afforded to the adhesive film for a semiconductor, thus lowering heat resistance; a modulus generated at 5% to 10% elongation of the adhesive film at room temperature may be significantly lowered, and yet elongation of the adhesive film at room temperature may be significantly increased; and in a dicing die bonding film manufactured using the adhesive film, burrs may be excessively generated through a dicing process, and a high temperature shearing force may also be decreased, and thus cuttability may not be sufficiently secured.

Meanwhile, the curing agent included in the adhesive film for a semiconductor may include a phenol resin having a softening point of 70° C. or more. The phenol resin may have a softening point of 70° C. or more, 80° C. or more, 70° C. to 160° C., greater than 100° C. and 160° C. or less, or 105° C. to 150° C.

The adhesive film for a semiconductor of the above embodiment may include a phenol resin having a relatively high softening point, and the phenol resin having a softening point of 70° C. or more, 80° C. or more, 70° C. to 160° C., greater than 100° C. and 160° C. or less, or 105° C. to 150° C. may form a base (or matrix) of the adhesive component together with the liquid epoxy resin and the thermoplastic resin having a glass transition temperature of −10° C. to 20° C., and affords a higher tensile modulus and excellent adhesive strength at room temperature and flow properties optimized for a semiconductor to the adhesive film for a semiconductor.

To the contrary, if the softening point of the phenol resin is less than the above-explained range, the tensile modulus of the adhesive film for a semiconductor at room temperature may be lowered or elongation at room temperature may be significantly increased, and melt viscosity of the adhesive film for a semiconductor may be decreased or the modulus may be lowered, and thus more burrs may be generated by heat generated in a dicing process or cuttability or pick-up efficiency may be lowered. Further, if a process of bonding the adhesive film or the adhesive film is exposed to high temperature conditions for a long time, a lot of bleed-out may be generated.

Further, the phenol resin may have a hydroxyl equivalent weight of 80 g/eq to 400 g/eq, or 100 g/eq to 400 g/eq. As the phenol resin has the above-explained hydroxyl equivalent weight range, the curing degree may be increased even with a short curing time, thus affording a higher tensile modulus and excellent adhesive strength at room temperature to the adhesive film for a semiconductor.

In the adhesive film for a semiconductor of the above embodiment, the weight ratio of the liquid epoxy resin to the phenol resin may be 0.5 to 1.5.

If the weight ratio of the liquid epoxy resin to the phenol resin is too high, breaking strength of the adhesive film for a semiconductor may be significantly increased, the tensile modulus at room temperature may be lowered, and cuttability or efficiency may be lowered in a low temperature cutting process.

Further, if the weight ratio of the liquid epoxy resin to the phenol resin is too low, the modulus generated at elongation at room temperature may become too high, or elongation at room temperature may be significantly lowered, thus significantly lowering the yield of the final product, and the adhesive film for a semiconductor may not have sufficient adhesion to a wafer, thus generating debonding between a wafer and an adhesive film in a manufacturing process.

Specific kinds and properties of the liquid epoxy resin are not significantly limited, and for example, the liquid epoxy resin may have a viscosity of 500 mPa·s to 20,000 mPa·s at 25° C. Further, the liquid epoxy resin may have an epoxy equivalent weight of 100 to 1,000.

Meanwhile, the liquid epoxy resin may form a base (or matrix) of the adhesive component together with the thermoplastic resin having a glass transition temperature of −10° C. to 20° C. and the curing agent containing a phenol resin, and allows the adhesive film to have relatively low viscosity and yet have excellent adhesive strength and flow properties optimized for a semiconductor, and thus may be favorable for void removal at the interface of the initial stage curing and in a die attachment process.

As explained above, the adhesive film for a semiconductor may include a thermoplastic resin having a glass transition temperature of −10° C. to 20° C.

Examples of the thermoplastic resin are not specifically limited, but for example, may include polyimide, polyether imide, polyester imide, polyamide, polyether sulfone, polyether ketone, polyolefin, polyvinylchloride, phenoxy, reactive butadiene acrylonitrile copolymer rubber, (meth)acrylate-based resin, a mixture of two or more kinds thereof, or a copolymer of two or more kinds thereof.

Specifically, the (meth)acrylate-based resin may be a (meth)acrylate-based resin including (meth)acrylate-based repeat units including an epoxy-based functional group, and having a glass transition temperature of −10° C. to 20° C.

By using the (meth)acrylate-based resin including (meth)acrylate-based repeat units including an epoxy-based functional group and having a glass transition temperature of −10° C. to 20° C., in case the adhesive film for a semiconductor is used for multistage lamination of an ultrathin wafer, high impact resistance may be secured and electrical properties after semiconductor manufacture may be improved.

The epoxy-based functional group may be substituted one or more at repeat units making up the main chain of the (meth)acrylate-based resin.

The epoxy-based functional group may include an epoxy group or a glycidyl group.

A (meth)acrylate-based resin including the (meth)acrylate-based repeat units including an epoxy-based functional group in the content of 0.1 wt % to 10 wt % may have a glass transition temperature of −10° C. to 20° C., or −5° C. to 15° C. By using a (meth)acrylate-based resin having the above-explained glass transition temperature, the adhesive film for a semiconductor may have sufficient flowability and the finally prepared adhesive film may secure high adhesive strength, and it is easy to prepare the adhesive film for a semiconductor in the form of a thin film and the like.

In order to control the curing degree of the adhesive film for a semiconductor or increase adhesion performance and the like, the adhesive film may include a solid epoxy resin.

Specific examples of the solid epoxy resin may include one or more kinds of polymer resins selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

The solid epoxy resin may have a softening point of 50° C. to 120° C. If the softening point of the solid epoxy resin is too low, adhesive strength of the adhesive film for a semiconductor may increase to decrease pick-up of chips after dicing, and if the softening point of the solid epoxy resin is too high, flowability of the adhesive film for a semiconductor may be lowered, and the adhesive strength may be lowered.

The solid epoxy resin may have an epoxy equivalent weight of 100 to 1,000.

If the content of the thermoplastic resin is too low in the adhesive film for a semiconductor, a modulus after curing of the resin composition may rapidly increase, and thus it is difficult to expect a stress relaxation effect between a substrate and a wafer. Further, if the content of the thermoplastic resin is too high, viscosity of the composition at a B-stage may increase, and thus adhesion to a substrate may decrease in a die attachment process and void removal during a curing process may become difficult, thus lowering reliability of the process and the final product.

If the content of the curing agent containing a phenol resin is too low, it may be difficult to secure sufficient heat resistance. If the content of the curing agent containing a phenol resin is too high, even if curing is completed, non-reacted phenol groups may remain to increase hygroscopicity, and thus, in a reflow process after moisture absorption in a semiconductor packaging process, delamination between a substrate and adhesive may be caused.

The adhesive film for a semiconductor may have a thickness of 1 µm to 300 µm. Further, the adhesive film may have a thickness of 1 µm or more, 3 µm or more, 5 µm or more, or 10 µm or more. In addition, the adhesive film may have a thickness of 300 µm or less, 100 µm or less, 90 µm or less, or 70 µm or less.

According to another embodiment of the invention, provided is an adhesive film for a semiconductor having a melt viscosity of 1,000 Pa·s to 4,000 Pa·s at a temperature of 110° C., and a shear rate of 5 rad/s, a modulus generated at 5% to 10% elongation at room temperature of 50 MPa or more, and elongation at room temperature of 500% or less.

Previously known adhesive films for a semiconductor could not secure low elongation at break together with high elasticity, and thus could not realize sufficient buriability and cuttability.

Further, previously, considering buriability of an adhesive film for a semiconductor and the like, a method of adding components having a low softening point to decrease melt viscosity has been suggested, but this method has a limit in that it is difficult to secure high elasticity and elongation at break is high.

Thus, the inventors confirmed through experiments that an adhesive film for a semiconductor having the above-described specific properties can more easily bury unevenness such as through a wire of a semiconductor substrate, a wire attached to a semiconductor chip, and the like, and yet can be applied to various cutting methods without specific limitations to realize excellent cuttability, thus improving reliability and efficiency of a semiconductor packaging process, and completed the invention.

Specifically, since a modulus generated at 5% to 10% elongation of the adhesive film for a semiconductor at room temperature is 50 MPa or more, or 50 MPa to 300 MPa, the adhesive film of the embodiment may be easily applied for non-contact-type cutting methods, for example, DBG (Dicing Before Grinding), as well as a wafer cutting method using a knife blade, and thus has excellent cuttability even at a low temperature.

If a modulus generated at 5% to 10% elongation of the adhesive film for a semiconductor at room temperature is less than 50 MPa, even if expanding is conducted at a low temperature, cuttability may not be sufficient; if allowed to stand at room temperature, readhesion may occur; and due to the heat generated when cutting a wafer to which the adhesive film is bonded, the adhesive may be softened to generate burrs in the adhesive film, thus contaminating the circuit side of a semiconductor chip.

Moreover, the adhesive film for a semiconductor has a melt viscosity of 1,000 Pa·s to 4,000 Pa·s at a temperature of 110° C. and a shear rate of 5 rad/s. As the adhesive film has relatively low viscosity at a temperature of about 110° C., it may have excellent adhesive strength and flow properties optimized for a semiconductor, it may be advantageous for void removal at the interface of the initial stage curing and in a die attachment process, and after die attachment, penetration of a bonding wire into a surrounding space may be smoothly achieved without significantly influencing the shape or properties of the adhesive film.

Further, as the adhesive film for a semiconductor has a melt viscosity of 1,000 Pa·s to 4,000 Pa·s at a temperature of 110° C. and a shear rate of 5 rad/s, even if exposed to a high temperature condition that is applied in a semiconductor manufacturing process for a long time, voids may not be substantially generated, and when applied for a dicing die bonding film and the like, sufficient high temperature shearing force may be secured, thus securing excellent cuttability.

Moreover, the adhesive film for a semiconductor may have elongation of 500% or less, 50 to 500%, or 100 to 400% at room temperature. Since the adhesive film for a semiconductor has relatively high elasticity and yet exhibits low elongation and low elongation at break, it may have excellent cuttability even at a low temperature, and may secure excellent cuttability even when non-contact-type cutting methods, for example, DBG (Dicing Before Grinding), are applied as well as a wafer cutting method using a knife blade.

Meanwhile, if the adhesive film for a semiconductor exhibits elongation greater than 500%, even if expanding is conducted at a low temperature, cuttability may not be sufficient; if allowed to stand at room temperature, readhesion may occur; and due to the heat generated when cutting a wafer to which the adhesive film is bonded, the adhesive may be softened to generate burrs in the adhesive film, thus contaminating the circuit side of a semiconductor chip.

The adhesive film may be used as a die attachment film (DAF) for attaching a lead frame or a substrate with a die or attaching a die with a die. Thus, the adhesive film may be processed in the form of a die bonding film, a dicing die bonding film, and the like.

As explained above, if the adhesive film for a semiconductor fulfills the requirements of a melt viscosity of 1,000 Pa·s to 4,000 Pa·s at a temperature of 110° C. and a shear rate of 5 rad/s, a modulus generated at 5% to 10% elongation at room temperature of 50 MPa or more, and elongation at room temperature of 500% or less, the above-explained effects may be realized, and the specific components are not significantly limited.

For example, the adhesive film for a semiconductor may include a thermoplastic resin having a glass transition temperature of −10° C. to 20° C., a curing agent containing a phenol resin having a softening point of 70° C. or more, a liquid epoxy resin, and a solid epoxy resin.

The details of the thermoplastic resin having a glass transition temperature of −10° C. to 20° C., a curing agent containing a phenol resin having a softening point of 70° C. or more, a liquid epoxy resin, and a solid epoxy resin include the contents explained above with regard to the adhesive film for a semiconductor of the above embodiments.

The adhesive film for a semiconductor may have a thickness of 1 μm to 300 μm. Further, the adhesive film may have a thickness of 1 μm or more, 3 μm or more, 5 μm or more, or 10 μm or more. In addition, the adhesive film may have a thickness of 300 μm or less, 100 μm or less, 90 μm or less, or 70 μm or less.

The curing agent included in each adhesive film for a semiconductor of the above-explained embodiments may further include one or more kinds of compounds selected from the group consisting of an amine-based curing agent and an acid anhydride-based curing agent.

The amount of the curing agent used may be appropriately selected considering the properties of the finally prepared adhesive film, and the like, and for example, it may be used in an amount of 10 to 700 parts by weight, or 30 to 300 parts by weight, based on 100 parts by weight of the epoxy resin.

The adhesive film for a semiconductor may further include a curing catalyst.

The curing catalyst functions for facilitating the action of the curing agent or the curing of the adhesive film for a semiconductor, and any curing catalysts known to be used in the manufacture of adhesive films for a semiconductor and the like may be used without significant limitations. For example, as the curing catalyst, one or more kinds selected from the group consisting of a phosphorus compound, a boron compound, a phosphorous-boron compound, and an imidazole-based compound may be used. The amount of the curing catalyst used may be appropriately selected considering the properties of the adhesive film, and the like, and for example, it may be used in an amount of 0.5 to 10 parts by weight, based 100 parts by weight of the liquid, the solid epoxy resin, the (meth)acrylate-based resin, and the phenol resin.

The adhesive film for a semiconductor may further include an ion scavenger including a metal oxide including one or more metals selected from the group consisting of zirconium, antimony, bismuth, magnesium, and aluminum; porous silicate; porous alumino silicate; or zeolite.

Examples of the metal oxide including one or more metals selected from the group consisting of zirconium, antimony, bismuth, magnesium, and aluminum may include zirconium oxide, an antimony oxide, a bismuth oxide, a magnesium oxide, an aluminum oxide, an antimony bismuth-based oxide, a zirconium bismuth-based oxide, a zirconium magnesium-based oxide, a magnesium aluminum-based oxide, an antimony magnesium-based oxide, an antimony aluminum-based oxide, an antimony zirconium-based oxide, a zirconium aluminum-based oxide, a bismuth magnesium-based oxide, a bismuth aluminum-based oxide, or a mixture of two or more kinds thereof.

The ion scavenger may function for adsorbing metal ions or halogen ions and the like existing inside the adhesive film for a semiconductor, and thus may improve electrical reliability of the wires in contact with the adhesive film.

The content of the ion scavenger in the adhesive film for a semiconductor is not significantly limited, but considering the reactivity with transition metal ions, workability, and the properties of the adhesive film manufactured from the resin composition, it may be included in the content of 0.01 to 20 wt %, preferably 0.01 to 10 wt %, based on the weight of the adhesive film for a semiconductor.

The adhesive film for a semiconductor may further include one or more kind of additives selected from the group consisting of a coupling agent and an inorganic filler. Examples of the coupling agent and inorganic filler are not particularly limited, and components known to be usable in an adhesive for semiconductor packaging may be used without significant limitations.

According to yet another embodiment of the invention, provided is a dicing die bonding film including a base film; a tacky layer formed on the base film; and an adhesive layer formed on the tacky layer, and including the adhesive film for a semiconductor according to any one of the above-explained embodiments.

As the adhesive layer of the dicing die bonding film includes the adhesive film for a semiconductor according to any one of the above-explained embodiments, the dicing die bonding film may have excellent mechanical properties such as heat resistance and impact resistance and the like, and high adhesive strength, and exhibit low hygroscopicity, thus preventing vaporization of moisture, delamination between a substrate and a die bonding film, or a reflow crack due to the vaporization and the like.

Further, as the adhesive layer of the dicing die bonding film includes the adhesive film for a semiconductor according to any one of the above-explained embodiments, the adhesive film for a semiconductor having the above-described specific properties can more easily bury unevenness such as through a wire of a semiconductor substrate or a wire attached to a semiconductor chip, and the like, and yet can be applied to various cutting methods without specific limitations to realize excellent cuttability, thus improving reliability and efficiency of a semiconductor packaging process.

In addition, as explained above, as the dicing die bonding film includes the adhesive film for a semiconductor having the above specific properties, it can be easily applied for non-contact types of cutting methods, for example, DBG (Dicing Before Grinding), as well as a wafer cutting method using a knife blade, and the adhesive layer may have excellent cuttability even at a low temperature.

The details of the adhesive films for a semiconductor according to any one of the above-explained embodiments are as explained above.

Specifically, the adhesive film for a semiconductor may have a melt viscosity of 1,000 Pa·s to 4,000 Pa·s at a temperature of 110° C. and a shear rate of 5 rad/s.

Further, the adhesive film for a semiconductor may have a modulus generated at 5% to 10% elongation at room temperature of 50 MPa or more.

In addition, the adhesive film for a semiconductor may have elongation of 500% or less.

The kind of the base film included in the dicing die bonding film is not specifically limited, and for example, plastic films or metal foils and the like known in this field may be used.

For example, the base film may include low density polyethylene, linear polyethylene, medium density polyethylene, high density polyethylene, ultra-low density polyethylene, a random copolymer of polypropylene, a block copolymer of polypropylene, a homopolypropylene, a polymethylpentene, an ethylene-vinylacetate copolymer, an ethylene-methacrylic acid copolymer, an ethylene-methylmethacrylate copolymer, an ethylene-ionomer copolymer, an ethylene-vinylalcohol copolymer, a polybutene, a copolymer of styrene, or a mixture of two or more kinds thereof.

The base film including a mixture of two or more kinds of polymers includes both a multi-layered film wherein each film layer includes the above-explained polymer, and a mono-layered film including two or more kinds of the above-explained polymers.

The thickness of the base film is not specifically limited, and commonly, it is formed to a thickness of 10 µm to 200 µm, preferably 50 µm to 180 µm. If the thickness is less than 10 µm, there is a concern that the control of cut depth may be unstable in a dicing process, and if it is greater than 200 µm, a lot of burrs may be generated in a dicing process, or elongation may decrease, and thus an expanding process may not be precisely achieved.

The base film, if necessary, may be subjected to general physical or chemical treatments such as a matte treatment, corona discharge, a primer treatment, crosslinking, and the like.

Meanwhile, the tacky layer may include a UV curable adhesive or a heat curable adhesive. In case the UV curable adhesive is used, UV is irradiated from the base film side to increase cohesiveness and glass transition temperature of the adhesive, thus lowering adhesive strength, and in case the heat curable adhesive is used, the temperature is increased to lower adhesive strength.

Moreover, the UV curable adhesive may include a (meth)acrylate-based resin, a UV curable compound, a photoinitiator, and a crosslinking agent.

The (meth)acrylate-based resin may have a weight average molecular weight of 100,000 to 1,500,000, preferably 200,000 to 1,000,000. If the weight average molecular weight is less than 100,000, coatability or cohesiveness may be lowered, and thus a residue may remain in the adherent at the time of delamination, or adhesive destruction may occur. Further, if the weight average molecular weight is greater than 1,500,000, the base resin may hinder the reaction of the UV curable compound, and thus there is a concern that a decrease in peel strength may not be efficiently achieved.

Examples of the (meth)acrylate-based resin may include a copolymer of (meth)acrylic acid ester-based monomers and crosslinkable functional group-containing monomers. Herein, examples of the (meth)acrylic acid ester-based monomers may include alkyl (meth)acrylate, specifically monomers having an alkyl group having a carbon number of 1 to 12, such as pentyl (meth)acrylate, n-butyl (meth)acrylate, ethyl(meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, decyl (meth)acrylate, or a mixture thereof. As the carbon number of the alkyl of the monomer becomes higher, the glass transition temperature of the final copolymer becomes lower, and thus appropriate monomers may be selected according to the desired glass transition temperature.

Examples of the crosslinkable functional group-containing monomers may include hydroxyl group-containing monomers, carboxyl group-containing monomers, nitrogen-containing monomers, or mixtures thereof. Examples of the hydroxyl group-containing compounds may include 2-hydroxyethyl (meth)acrylate, 2-hydroxypropyl (meth)acrylate, and the like, examples of the carboxyl group-containing compounds may include (meth)acrylate and the like, and examples of the nitrogen-containing monomers may include (meth)acrylonitrile, N-vinyl pyrrolidone, N-vinyl caprolactam, and the like, but are not limited thereto.

In the (meth)acrylate-based resin, carbon-carbon double bond-containing low molecular weight compounds such as vinyl acetate, styrene, acrylonitrile, and the like may be additionally included so as to improve other functionalities such as compatibility and the like.

The kind of the UV curable compounds is not specifically limited, and for example, multifunctional compounds having a weight average molecular weight of 500 to 300,000 (e.g. multifunctional urethane acrylate, multifunctional acrylate monomers or oligomers, and the like) may be used. One of ordinary knowledge in the art could easily select appropriate compounds according to the desired use.

The content of the UV curable compound may be 5 to 400 parts by weight, preferably 10 to 200 parts by weight, based on 100 parts by weight of the above-explained base resin. If the content of the UV curable compound is less than 5 parts by weight, an adhesion decrease after curing may not be sufficient, and thus there is a concern of lowering pick-up, and if it is greater than 400 parts by weight, cohesiveness of the adhesive before UV irradiation may be insufficient, or delamination from a release film and the like may not be easily achieved.

The kind of the photoinitiator is not specifically limited, and those commonly known in this field may be used, wherein the content may be 0.05 parts by weight to 20 parts by weight, based on 100 parts by weight of the UV curable compound. If the content of the photoinitiator is less than 0.05 parts by weight, a curing reaction by UV irradiation may become insufficient to lower pick-up, and if it is greater than 20 parts by weight, a crosslinking reaction may occur with a short unit in the curing process, non-reacted UV curable compounds may be generated to cause residue on the adherent surface, or peel strength after curing may excessively decrease to lower pick-up.

Further, the kind of the crosslinking agent that is included in the tacky part to afford adhesion and cohesiveness is also not specifically limited, and those commonly used such as isocyanate-based compounds, aziridine-based compounds, epoxy-based compounds, metal chelate-based compounds, and the like may be used. The crosslinking agent may be included in the content of 2 parts by weight to 40 parts by weight, preferably 2 parts by weight to 20 parts by weight, based on 100 parts by weight of the base resin. If the content is less than 2 parts by weight, cohesiveness of the adhesive may be insufficient, and if it is greater than 20 parts by weight, adhesion before UV irradiation may be insufficient, and thus there is a concern of chip scattering and the like. Further, in the tacky layer, tackifiers such as a rosin resin, a terpene resin, a phenol resin, a styrene resin, an aliphatic petroleum resin, an aromatic petroleum resin, an aliphatic aromatic copolymer petroleum resin, and the like may be further included.

A method for forming a tacky layer including the above components on a base film is not specifically limited, and for example, a method of directly coating an adhesive composition on a base film to form a tacky layer, or a method of firstly coating an adhesive composition on a peelable base to prepare a tacky layer, and then transcribing the tacky layer to a base film using a peelable base, and the like may be used.

Herein, the methods of coating and drying the adhesive composition are not specifically limited, and for example, a method of coating the composition including the above components as it is, or diluting it in an appropriate organic solvent and coating by known means such as a comma coater, a gravure coater, a die coater, a reverse coater, and the like, and then drying the solvent at a temperature of 60° C. to 200° C. for 10 s to 30 min, may be used. Further, in the above process, an aging process may be further conducted so as to progress sufficient crosslinking of the adhesive.

Although the thickness of the tacky layer is not significantly limited, for example, it may be in the range of 1 µm to 600 µm, 3 µm to 500 µm, or 5 µm to 300 µm.

As explained above, the adhesive layer is formed on the tacky layer, and may include the adhesive film for a semiconductor of the above-explained embodiment. The details of the adhesive film for a semiconductor include those explained above.

Although the thickness of the adhesive layer is not significantly limited, for example, it may be 1 µm to 300 µm. Further, the adhesive film may have a thickness of 1 µm or more, 3 µm or more, 5 µm or more, or 10 µm or more. In addition, the adhesive film may have a thickness of 300 µm or less, 100 µm or less, 90 µm or less, or 70 µm or less.

The dicing die bonding film may further include a release film formed on the adhesive layer. Examples of the release film that can be used may include one or more kinds of plastic films such as a polyethylene terephthalate film, a polytetrafluoroethylene film, a polyethylene film, a polypropylene film, a polybutene film, a polybutadiene film, a vinylchloride copolymer film, a polyimide film, and the like.

The surface of the release film may be treated with one or more of alkyd-based, silicon-based, fluorine-based, unsaturated ester-based, polyolefin-based, or wax-based release agents, among which heat resistant alkyd-based, silicon-based, or fluorine-based release agents may be preferable.

The release film may be commonly formed to a thickness of 10 µm to 500 µm, preferably about 20 µm to 200 µm, but is not limited thereto.

A method for manufacturing the above-explained dicing die bonding film is not specifically limited, and for example, a method of sequentially forming a tacky part, an adhesive part, and a release film on a base film, or a method of separately preparing a dicing film (a base film+a tacky part) and a release film on which a die bonding film or an adhesive part is formed, and then laminating them, and the like, may be used.

The lamination method is not specifically limited, and hot roll lamination or a laminate press may be used, among which hot roll lamination is preferable in terms of possibility of a continuous process and efficiency. The hot roll lamination may be conducted at a temperature of 10° C. to 100° C. and a pressure of 0.1 kgf/cm$^2$ to 10 kgf/cm$^2$, but is not limited thereto.

According to yet another embodiment of the invention, provided is a method for dicing a semiconductor wafer, including the steps of: partially pre-treating a semiconductor wafer including the dicing die bonding film; laminating a wafer on at least one side of the dicing die bonding film so as to be completely cut or cuttable; and irradiating UV to the base film of the pre-treated semiconductor wafer and picking up individual chips separated by the cutting of the semiconductor.

The details of the dicing die bonding film include those explained above.

Except the particulars regarding the steps of the dicing method, commonly known apparatuses and methods used for the dicing method of a semiconductor wafer and the like may be used without specific limitations.

The method for dicing a semiconductor wafer may further include a step of expanding the semiconductor wafer after the pretreatment. In this case, processes of irradiating UV to the base film of the expanded semiconductor wafer and picking up individual chips separated by cutting of the semiconductor wafer are followed.

By using the dicing die bonding film including the dicing film, burrs that may be generated during a dicing process of a semiconductor wafer may be minimized, thus preventing contamination of a semiconductor chip and improving reliability and lifetime of a semiconductor chip.

Specific embodiments of the invention will be explained in detail in the following examples. However, these examples are only to illustrate specific embodiments of the invention, and the scope of the invention is not limited thereto.

Examples 1 to 5 and Comparative Examples 1 to 3: Preparation of an Adhesive Resin Composition for a Semiconductor and an Adhesive Film for a Semiconductor Example 1

(1) Preparation of a Solution of an Adhesive Resin Composition for a Semiconductor 40 g of phenol resin KH-6021 (produced by DIC Corporation, bisphenol A novolac resin, hydroxyl equivalent weight 121 g/eq, softening point: 125° C.), which is a curing agent of epoxy resin, 38 g of epoxy resin EOCN-104S (produced by Nippon Kayaku Co., Ltd., cresol novolac type of epoxy resin, epoxy equivalent weight 214 g/eq, softening point: 83° C.), 50 g of liquid epoxy resin RE-310S (produced by Nippon Kayaku Co., Ltd., bisphenol A epoxy resin, epoxy equivalent weight 180 g/eq), 40 g of thermoplastic acrylate resin KG-3015 (Mw: 900,000, glass transition temperature: 10° C.), 5 g of silane coupling agent A-187 (GE Toshiba Silicone, gamma-glycidoxypropyltrimethoxysilane), 0.1 g of a curing accelerator 2PZ (Shikoku Chemicals Corporation, 2-phenyl imidazole), and 100 g of filler SC-2050 (Admatec Corporation, spherical silica, mean particle diameter about 400 nm) were mixed in a methyl ethyl ketone solvent to obtain a solution of an adhesive composition for a semiconductor (solid content 20 wt %).

(2) Preparation of a Die Bonding Film

The above prepared solution of an adhesive composition for a semiconductor was coated on a release-treated polyethylene terephthalate film (thickness 38 µm), and then dried at 110° C. for 3 min to obtain an adhesive film for a semiconductor (die bonding film) with a thickness of about 60 µm.

Examples 2 to 5

Solutions of adhesive resin compositions for a semiconductor (solid content 20 wt %) and adhesive films for a semiconductor (die bonding films) were obtained by the same method as Example 1, except for applying the components and the amounts described in the following Table 1.

Comparative Examples 1 and 2

Adhesive films for a semiconductor (die bonding films) were obtained by the same method as Example 1, except that solutions of adhesive resin compositions for a semiconductor (methyl ethyl ketone 20 wt % concentration) were prepared using the components and the contents of the following Table 1.

TABLE 1

Compositions of the resin compositions of examples and comparative examples [unit: g]

| | | Example 1 | Example 2 | Example 3 | Example 4 | Example 5 | Example 6 | Comparative Example 1 | Comparative Example 2 |
|---|---|---|---|---|---|---|---|---|---|
| Phenol resin | KH-6021 | 40 | 59 | 59 | 60 | | | 40 | |
| | GPH-103 | | | | | 60 | 40 | | |
| | HE200C-17 | | | | | | 20 | | |
| | KPH-3065 | | | | | | | | 40 |
| Liquid epoxy resin | RE-310S | 50 | 50 | 40 | 40 | 35 | 40 | 65 | 50 |
| solid epoxy resin | EOCN-104S | 38 | 35 | 35 | 32 | 45 | 45 | 35 | 45 |
| acryl resin | KG-3015P | 40 | 40 | 40 | 40 | 40 | 40 | 40 | 40 |
| Curing accelerator | 2PZ | 0.1 | 0.1 | 0.1 | 0.1 | 0.1 | 0.1 | 0.1 | 0.1 |
| Coupling agent | A-187 | 5 | 5 | 5 | 5 | 5 | 5 | 5 | 5 |
| Filler | SC-2050 | 100 | 100 | 100 | 100 | 110 | 110 | 100 | 100 |

KH-6021: bisphenol A novolac resin (DIC Corporation, softening point: 125° C.)
GPH-103: biphenyl novolac resin (Nippon Kayaku Co., Ltd., softening point: 103° C.)
HE200C-17: biphenyl novolac resin (Air Water Co., Ltd., softening point: 75° C.)
KPH-3065: xyloc A novolac phenol resin (Kolon Chemical Co., Ltd., hydroxyl equivalent weight: 180 g/eq, softening point 67° C.)
KG-3015P: acrylate-based resin (including 3 wt % of glycidylmethacrylate-based repeat units, glass transition temperature: 10° C., weight average molecular weight 900,000)
EOCN-104S: cresol novolac epoxy (Nippon Kayaku Co., Ltd., epoxy equivalent weight: 180 g/eq, softening point: 90° C.)
RE-310S: bisphenol A epoxy liquid resin (Nippon KayaKu, epoxy equivalent weight: about 180 g/eq, viscosity at 25° C.: about 13,000 to 17,000 mPa · s)

Experimental Examples: Assessment of the Properties of Adhesive Films for a Semiconductor Experimental Example 1: Measurement of Melt Viscosity The adhesive films respectively obtained in examples and comparative examples were stacked to a thickness of 650 μm, and then laminated using a roll laminator at 60° C. Thereafter, each specimen was formed in a circular shape with a diameter of 10 mm, and then melt viscosity according to temperature was measured at a temperature range of 40° C. to 160° C., a shear rate of 1 Hz and 5 rads, and a temperature rise rate of 20° C./min, using advanced rheometric expansion system (ARES) of TA Corporation.

Experimental Example 2: Assessment of Room Temperature Tensile Properties

In order to measure the tensile properties of the adhesive films respectively obtained in examples and comparative examples, a Texture Analyzer (Stable Micro System, Ltd.) was used. Specifically, the adhesive films respectively obtained in examples and comparative examples were cut to a size of width 15 mm and length 100 mm to prepare samples, and both ends were taped while leaving 50 mm of the central part of the sample. Further, both ends of the taped samples were fixed to the apparatus, and while elongating at a speed of 0.3 mm/s, a tensile curve was drawn. From the tensile curve, a gradient value at 5% elongation was measured to determine a modulus, and a time when the sample was completely cut was measured to determine elongation.

Experimental Example 3: Observation of Burr Generation (1) Manufacture of a Dicing Film 75 g of 2-ethylhexyl acrylate, 10 g of 2-ethylhexyl methacrylate, and 15 g of 2-hydroxyethyl acrylate were copolymerized in 300 g of an ethylacrylate solvent to obtain a copolymer having a weight average molecular weight of 850,000 (glass transition temperature: 10° C.), and then 10 g of a photocurable material acrylisocyanate compound was added thereto, thus obtaining a reactant. Thereafter, 10 g of a multifunctional isocyanate oligomer and 1 g of Darocur TPO as a photoinitiator were mixed to prepare a UV curable adhesive composition.

The UV curable adhesive composition was coated on a release-treated polyester film having a thickness of 38 μm so that the thickness after drying became 10 μm, and dried at 110° C. for 3 min. The dried tacky layer was laminated on a polyolefin film having a thickness of 100 μm to manufacture a dicing film.

(2) Manufacture of a Dicing Die Bonding Film

The tacky layer obtained in the above process and each adhesive film obtained in examples and comparative examples (width: 18 mm, length: 10 cm) were laminated to manufacture a multi-layered adhesive film for dicing die bonding.

(3) Measurement of Burr Generation Rate

Each dicing die bonding film prepared above was laminated at 50° C. using a 100 μm wafer and a wafer ring mounter, and diced to a 10 mm*10 mm chip size at a speed of 40K rpm and 20 mm/s, using a dicing apparatus, and then the number of burrs generated on the die was confirmed to measure the burr generation rate.

Experimental Example 4: Assessment of High Temperature Shearing Force

On the mirror side of a wafer having thickness of about 600 μm to 700 μm, the adhesive films respectively obtained in examples and comparative examples were laminated under a condition of 60° C., and the wafer was fragmented to a size of 5 mm*5 mm to prepare adhesive films with the die size. Further, a 70 μm wafer mirror of a 10 mm*10 mm size was located on a hot plate at 130° C., and then the die bonding film was attached under conditions of a wafer die at 2 kg and 2 s, curing was progressed at 125° C. for 1 h, and curing was progressed again at 175° C. for 2 h.

In addition, using a Die Shear Tester DAGE 4000, while pushing the wafer die at 250° C. at a speed of 0.05 mm/s, force was measured, to measure the high temperature shearing force.

Experimental Examples 5: Assessment of Cuttability

The adhesives obtained in Examples 1 to 4 and Comparative Examples 1 and 2 were laminated to dicing films, thus manufacturing dicing die bonding films.

Using an 8 inch wafer with a 50 μm thickness that was pre-cut to a size of 5 mm*5 mm and a wafer ring mounter, each dicing die bonding film prepared above was laminated at 60° C., and then allowed to stand at room temperature for 30 min. Thereafter, the wafer to which the dicing die bonding film was laminated was installed in a low temperature chamber, and low temperature expansion was conducted to a height of 5 mm at a speed of 100 mm/s at −10° C. Further, the wafer was transferred to a thermal shrinking device, and expanded to 4 mm at 1 mm/s, and then heated to thermally shrink the dicing film. Thereafter, the cut ratio of the wafer at room temperature was confirmed.

As shown in Table 2, it was confirmed that as the adhesive films manufactured in Examples 1 to 5 have a modulus generated at 5% to 10% elongation at room temperature in the range of 50 MPa to 150 MPa, melt viscosity of 1,000 Pa·s to 4,000 Pa·s at a temperature of 110° C. and a shear rate of 5 rad/s, and elongation at room temperature of 500% or less, even if expanding is conducted at room temperature, 100% cuttability may be secured.

It was also confirmed that in the dicing die bonding films manufactured using the adhesive films of Examples 1 to 5, burrs are not substantially generated through the dicing process, and the adhesive films of Examples 1 to 5 have high high-temperature shearing force, and thus have improved heat resistance and adhesive strength.

The adhesive film of Comparative Example 1 was prepared such that the weight ratio of the total contents of the solid epoxy resin and the liquid epoxy resin to the thermoplastic resin became greater than 2.6, and the weight ratio of the phenol resin to the total weight of the thermoplastic resin, phenol resin, and liquid epoxy resin became less than 0.280. As shown in Table 2, it was confirmed that in the case of the adhesive film of Comparative Example 1, a modulus generated at 5% to 10% elongation at room temperature is less than 40 MPa, and elongation at room temperature is greater than 550%.

Further, it was also confirmed that in the case of Comparative Example 2 wherein a phenol resin having a low softening point was used, a modulus generated at 5% to 10% elongation at room temperature is less than 30 MPa, and elongation at room temperature amounts to 750%.

It was confirmed that as the adhesive films of Comparative Examples 1 and 2 have high elongation at room temperature, and they have low cuttability through the low temperature expanding process, and thus it is difficult to secure sufficient cuttability, as shown in Table 2.

Further, it was confirmed that in the dicing die bonding films manufactured using the adhesive films of Comparative Examples 1 and 2, burrs are generated at 20% or more

TABLE 2

Results of Experimental Examples

| | Example 1 | Example 2 | Example 3 | Example 4 | Example 5 | Example 6 | Comparative Example 1 | Comparative Example 2 |
|---|---|---|---|---|---|---|---|---|
| Melt viscosity (5 rads, 110° C.) [unit: Pa * s] | 2000 | 1900 | 2100 | 1900 | 2000 | 1970 | 2600 | 2200 |
| Modulus at 5% elongation at room temperature [unit: MPa] | 66 | 84 | 110 | 130 | 110 | 95 | 38 | 25 |
| Modulus at 10% elongation at room temperature [unit: MPa] | 59 | 75 | 95 | 115 | 97 | 89 | 32 | 21 |
| Room temperature elongation [unit: %] | 350 | 290 | 250 | 150 | 210 | 250 | 550 | 750 |
| High temperature shearing force [unit: MPa] | 7.8 | 8.1 | 10.2 | 11.2 | 6.5 | 6.7 | 5.6 | 3.2 |
| Whether or not burr is generated | Not generated | Not generated | Not generated | Not generated | Not generated | Not generated | 20% generated | 35% generated |
| Cuttability | 100% | 100% | 100% | 100% | 100% | 100% | 70% | 50% | through the dicing process, and that the adhesive films of Comparative Examples 1 and 2 do not have sufficient high temperature shearing force, and thus it is difficult to secure sufficient adhesive strength.

The invention claimed is:

1. An adhesive film for a semiconductor having a melt viscosity of 1,000 Pa·s to 4,000 Pa·s at a temperature of 110° C. and a shear rate of 5 rad/s, and a modulus generated at 5% to 10% elongation at room temperature of 75 MPa to 300 MPa,
    wherein the adhesive film for a semiconductor comprises a thermoplastic resin having a glass transition temperature of −10° C. to 20° C., a curing agent containing a phenol resin having a softening point of greater than 100° C. and 160° C. or less, a liquid epoxy resin, and a solid epoxy resin,
    wherein a weight ratio of total contents of the solid epoxy resin and the liquid epoxy resin to the thermoplastic resin is 1.6 to 2.6, and
    wherein a weight ratio of the phenol resin to the total weight of the thermoplastic resin, the phenol resin, and the liquid epoxy resin is 0.333 to 0.600.

2. A die attachment film (DAF), comprising the adhesive film for a semiconductor according to claim 1.

3. The die attachment film of claim 2, further comprising a base film and a tacky layer formed on the base film.

4. The adhesive film for a semiconductor according to claim 1, wherein the adhesive film has a thickness of 1 μm to 300 μm.

5. An adhesive film for a semiconductor having a melt viscosity of 1,000 Pa·s to 4,000 Pa·s at a temperature of 110° C. and a shear rate of 5 rad/s, and elongation at room temperature of 500% or less,
    wherein the adhesive film for a semiconductor comprises a thermoplastic resin having a glass transition temperature of −10° C. to 20° C., a curing agent containing a phenol resin having a softening point of greater than 100° C. and 160° C. or less, a liquid epoxy resin, and a solid epoxy resin,
    wherein a weight ratio of total contents of the solid epoxy resin and the liquid epoxy resin to the thermoplastic resin is 1.6 to 2.6,
    wherein a weight ratio of the phenol resin to the total weight of the thermoplastic resin, the phenol resin, and the liquid epoxy resin is 0.333 to 0.600, and
    wherein a modulus generated at 5% to 10% elongation at room temperature is 75 MPa to 300 MPa.

6. A die attachment film (DAF), comprising the adhesive film for a semiconductor according to claim 5.

7. The die attachment film of claim 6, further comprising a base film and a tacky layer formed on the base film.

8. The adhesive film for a semiconductor according to claim 5, wherein the adhesive film has a thickness of 1 μm to 300 μm.

9. An adhesive film for a semiconductor having a modulus generated at 5% to 10% elongation at room temperature of 75 MPa to 300 MPa, and elongation at room temperature of 500% or less,
    wherein the adhesive film for a semiconductor comprises a thermoplastic resin having a glass transition temperature of −10° C. to 20° C., a curing agent containing a phenol resin having a softening point of greater than 100° C. and 160° C. or less, a liquid epoxy resin, and a solid epoxy resin,
    wherein a weight ratio of total contents of the solid epoxy resin and the liquid epoxy resin to the thermoplastic resin is 1.6 to 2.6, and
    wherein a weight ratio of the phenol resin to the total weight of the thermoplastic resin, the phenol resin, and the liquid epoxy resin is 0.333 to 0.600.

10. A die attachment film (DAF), comprising the adhesive film for a semiconductor according to claim 9.

11. The die attachment film of claim 10, further comprising a base film and a tacky layer formed on the base film.

12. The adhesive film for a semiconductor according to claim 9, wherein the adhesive film has a thickness of 1 μm to 300 μm.

13. An adhesive film for a semiconductor having a melt viscosity of 1,000 Pa·s to 4,000 Pa·s at a temperature of 110° C. and a shear rate of 5 rad/s, a modulus generated at 5% to 10% elongation at room temperature of 75 MPa to 300 MPa, and elongation at room temperature of 500% or less,
    wherein the adhesive film for a semiconductor comprises a thermoplastic resin having a glass transition temperature of −10° C. to 20° C., a curing agent containing a phenol resin having a softening point of greater than 100° C. and 160° C. or less, a liquid epoxy resin, and a solid epoxy resin,
    wherein a weight ratio of total contents of the solid epoxy resin and the liquid epoxy resin to the thermoplastic resin is 1.6 to 2.6, and
    wherein a weight ratio of the phenol resin to the total weight of the thermoplastic resin, the phenol resin, and the liquid epoxy resin is 0.333 to 0.600.

14. A die attachment film (DAF), comprising the adhesive film for a semiconductor according to claim 13.

15. The die attachment film of claim 14, further comprising a base film and a tacky layer formed on the base film.

16. The adhesive film for a semiconductor according to claim 13, wherein the adhesive film has a thickness of 1 μm to 300 μm.

* * * * *